(12) United States Patent
Block et al.

(10) Patent No.: US 11,450,753 B2
(45) Date of Patent: Sep. 20, 2022

(54) EDGE CELL SIGNAL LINE ANTENNA DIODES

(71) Applicant: GLOBALFOUNDRIES U.S. Inc., Santa Clara, CA (US)

(72) Inventors: Stefan Block, Munich (DE); Herbert Johannes Preuthen, Dorfen (DE); Ulrich Hensel, Radeberg (DE)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 174 days.

(21) Appl. No.: 16/404,881

(22) Filed: May 7, 2019

(65) Prior Publication Data

US 2020/0357897 A1 Nov. 12, 2020

(51) Int. Cl.
*H01L 29/66* (2006.01)
*H01L 27/02* (2006.01)
*H01L 27/12* (2006.01)
*H01L 29/861* (2006.01)

(52) U.S. Cl.
CPC ............ *H01L 29/66121* (2013.01); *H01L 27/0255* (2013.01); *H01L 27/1207* (2013.01); *H01L 29/861* (2013.01)

(58) Field of Classification Search
CPC .......... H01L 29/66121; H01L 27/0255; H01L 27/1207; H01L 29/861

USPC ........................................ 257/173, 621, 629
See application file for complete search history.

(56) References Cited

U.S. PATENT DOCUMENTS

| 8,183,602 | B2 * | 5/2012 | Tabata | G11C 13/0009 |
| | | | | 257/211 |
| 9,773,811 | B2 | 2/2017 | Lorenz et al. | |
| 2005/0269642 | A1 * | 12/2005 | Minami | H01L 27/1203 |
| | | | | 257/355 |
| 2008/0017906 | A1 * | 1/2008 | Pelella | H01L 27/1203 |
| | | | | 257/306 |

* cited by examiner

*Primary Examiner* — Ajay Arora
(74) *Attorney, Agent, or Firm* — Francois Pagette; Hoffman Warnick LLC

(57) ABSTRACT

Aspects of the disclosure provide a semiconductor device and method of manufacturing. Embodiments of the disclosure enable placing of protective structures without modifying spacing rules. The device includes a first device region defined above a substrate, the first device region being isolated from the substrate by a buried insulating layer. The first device region includes a first power rail, a first signal line traversing at least a first portion of the first device region, and a first plurality of edge cells positioned in the substrate adjacent the first device region. A first edge cell includes a substrate contact connecting the first power rail to the substrate and a first signal line antenna diode connecting the first signal line to the substrate.

20 Claims, 4 Drawing Sheets

EDGE CELL SIGNAL LINE ANTENNA DIODES

BACKGROUND

Field of the Disclosure

Generally, the present disclosure relates to semiconductor devices and, in particular, to techniques for forming signal line antenna diodes in edge cells to control plasma antenna effects during plasma treatments performed during the manufacturing of semiconductor devices.

DESCRIPTION OF THE RELATED ART

In manufacturing semiconductor products, such as integrated circuits, individual components, such as transistors, diodes and the like, may typically involve a plurality of process steps performed on the basis of an appropriate carrier or substrate material. The substrate material, frequently provided in the form of an appropriate semiconductor material, such as silicon and the like, is processed by patterning specific device-related structures, which typically involves the deposition of one or more appropriate material layers, providing a respective mask layer so as to define the lateral size and shape of the respective features, followed by a patterning process, such as an etch process, in order to remove unwanted material portions of the previously deposited one or more material layers. In this manner, layer-for-layer, further components of a specific circuit element may be formed, wherein precise alignment to the previously patterned layers is required.

Plasma-assisted process techniques allow etch processes to be performed on the basis of a highly directional behavior. In a plasma technique, certain species in the plasma ambient may be ionized and appropriately accelerated to the substrate material to be treated, thereby obtaining a high degree of directionality of the respective accelerated particles. The chemical effect of a plurality of etch species can be provided with a well-defined directionality, thereby providing "anisotropic" etch characteristics for plasma-assisted removal processes without regard for the crystallographic orientation of the materials. Moreover, plasma-assisted processes have also been introduced into other concepts, such as deposition processes, in which the reactive behavior of certain components can be increased without requiring specific high temperatures, which would otherwise be necessary for initiating a desired chemical reaction. In still other cases, plasma treatments for incorporating certain species, adjusting surface characteristics of specific material layers and the like, are also frequently applied in sophisticated manufacturing strategies for forming semiconductor devices.

When using a plasma ambient for treating a semiconductor substrate, however, certain side effects are involved, since, depending on the materials exposed to the plasma ambient, the more or less continuous "bombardment" of charged particles may affect exposed surface areas or even underlying material components. That is, a certain surface area may act as an "antenna" on which charge may accumulate due to the continuous "bombardment" of charged particles of the plasma ambient. Therefore, the respective charge may have to be discharged in order to prevent undue voltages from building up within the substrate to be treated. For example, when patterning a gate electrode structure for a field effect transistor, a relatively thin gate dielectric material, which may have a thickness of several nanometers and even less in sophisticated devices, may have to be formed in combination with appropriate electrode materials, such as polysilicon and the like. Since a corresponding patterning process requires precise transfer of the mask dimensions into the underlying material layers, respective plasma-assisted etch recipes have to be applied, thereby also contributing to respective adverse side effects of the plasma ambient. During certain phases of the overall patterning process, charge may accumulate in the respective antenna, i.e., for instance, the gate electrode material, and may possibly lead to voltages that may exceed the breakdown voltage of the sensitive gate dielectric materials. Therefore, respective discharge paths may have to be provided for the charge during a plasma treatment in order to reliably restrict the accumulation of charges to a non-critical level. For example, the substrate material may be connected to a corresponding electrode assembly of the plasma process tool in order to discharge unwanted charges, which, in turn, may be discharged from respective critical surface areas into the substrate material. With the introduction of ever-decreasing feature sizes and more complex structures and, in particular, the incorporation of device architectures resulting in substantially vertically isolated device areas, such as semiconductor—or silicon-on-insulator (SOI) configurations, it becomes increasingly difficult to provide appropriate discharge paths for maintaining parasitic voltages at a non-critical level during plasma treatments.

For these reasons, circuit designers have been forced to intentionally add respective discharge structures, such as substrate diodes in combination with appropriate conductive paths, which may connect to critical device features, such as gate electrode structures, drain and source regions and, in particular, to SOI transistors, and the like, so as to provide efficient discharge mechanisms during one or more plasma treatments. Consequently, significant efforts have been made in order to appropriately implement corresponding diode structures, also typically referred to as antenna diodes, into the overall design and to provide appropriate conductive paths that are available during the various stages of the overall manufacturing processes in order to avoid or at least significantly reduce the probability of plasma-induced damage of sensitive device areas.

Such protective structures are typically placed after an initial layout is completed and antenna violations are identified. The device layout is typically modified to provide room for the protective structures without violating spacing rules. After placing the protective structures and modifying the layout, the process is repeated until all antenna violations have been addressed. A typical device layout may have hundreds or thousands of antenna violations. The iterative process for addressing these violations can be quite lengthy, increasing the design time and expense.

The present disclosure is directed to various methods and resulting devices that may avoid, or at least reduce, the effects of one or more of the problems identified above.

SUMMARY

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure contemplates devices, manufacturing techniques and strategies for addressing the problem of reduced device performance due to parasitic capacitance, leakage currents and the like, associated with the provision of respective protective diode structures and respective conductive paths required for restricting or avoiding plasma-induced damage in sensitive device areas, such as source and drain regions and gate electrode structures of sophisticated transistor elements.

One illustrative embodiment disclosed herein relates to a semiconductor device. The semiconductor device includes, among other things, a first device region defined above a substrate, wherein the first device region is isolated from the substrate by a buried insulating layer, the first device region including a first power rail, a first signal line traversing at least a first portion of the first device region, and a first plurality of edge cells positioned in the substrate adjacent the first device region, wherein at least a first edge cell of the first plurality of edge cells includes a substrate contact connecting the first power rail to the substrate and a first signal line antenna diode connecting the first signal line to the substrate.

One illustrative method includes, among other things, forming a first device region defined above a substrate, wherein the first device region is isolated from the substrate by a buried insulating layer, the first device region including a first power rail, forming a first signal line traversing at least a first portion of the first device region, and forming a first plurality of edge cells in the substrate adjacent the first device region, wherein forming the first plurality of edge cells includes forming a substrate contact in the substrate connecting the first power rail to the substrate for a first edge cell and forming a first signal line antenna diode in the substrate connecting the first signal line to the substrate in the first edge cell.

BRIEF DESCRIPTION OF THE DRAWINGS

The disclosure may be understood by reference to the following description taken in conjunction with the accompanying drawings, in which like reference numerals identify like elements, and in which.

Figure 1:
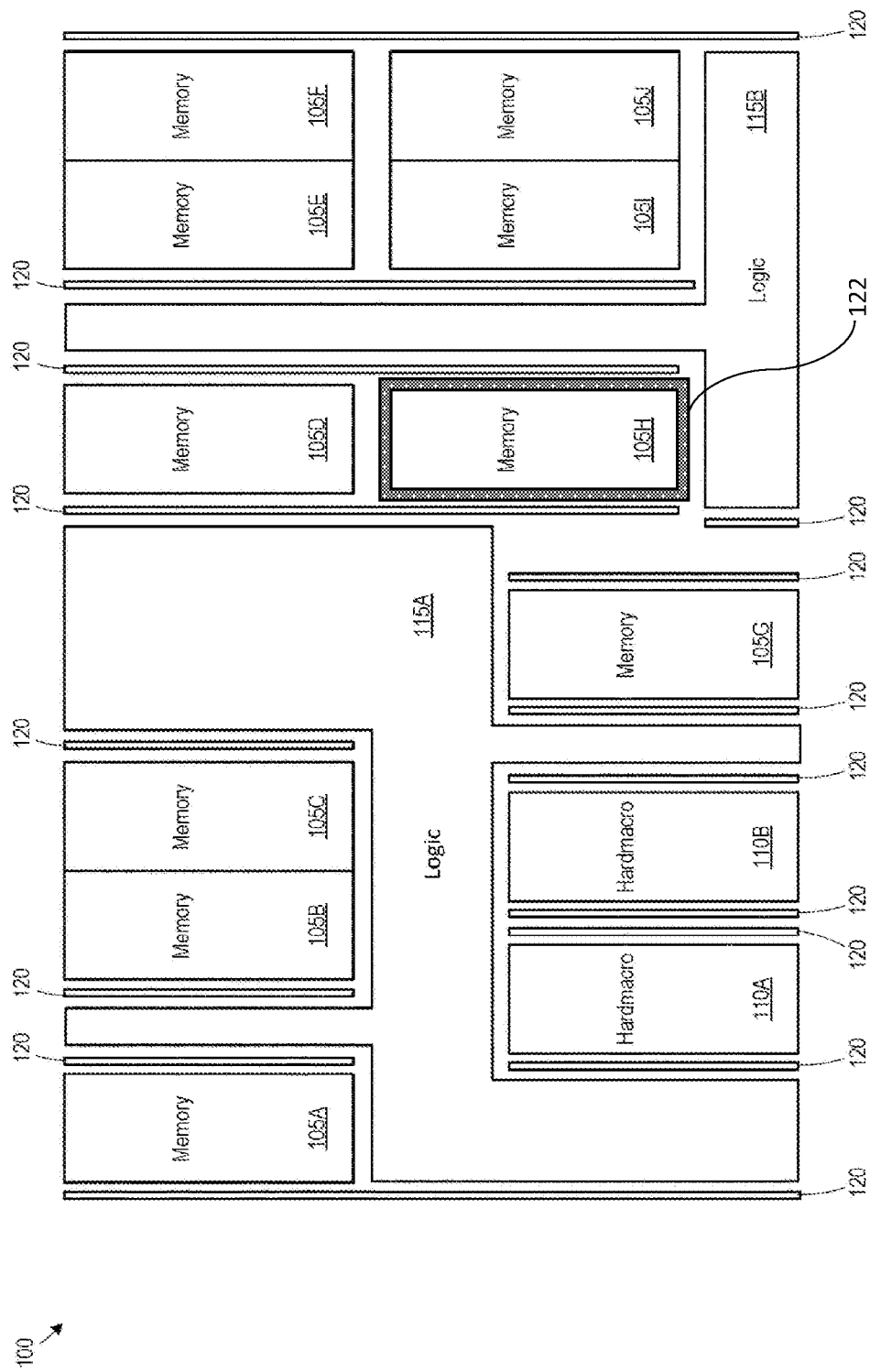
FIG. 1 schematically illustrates a simplified plan view of a semiconductor product including device regions and edge cells with signal line antenna diodes.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

FIG. 1 schematically illustrates a simplified plan view of a portion of a semiconductor product 100 including device regions, such as memory regions 105A-105J, hardmacro regions 110A-110B, and logic regions 115A, 115B, and edge cell regions 120 positioned adjacent boundaries of the device regions. In some embodiments, the memory regions 105A-105J are static random access memory (SRAM) regions. In some embodiments, the hardmacro regions 110A-110B represent predesigned logic blocks with fixed layouts that generally provide fixed performance parameters and timing. A particular hardmacro may be employed in multiple device designs. For example, a hardmacro may represent a processor with a fixed layout that a customer buys from another supplier and includes in a particular device layout to ensure that the processor runs with a given speed.

The memory regions 105A-105J, hardmacro regions 110A-110B, and logic regions 115A, 115B are formed in silicon-on-insulator (SOI) regions of the product 100 where a buried insulating layer (e.g., silicon dioxide) separates the devices from the bulk substrate. The bulk substrate may be made of silicon or it may be made of materials other than silicon. The edge cell regions 120 are formed in bulk regions outside the SOI regions. For example, the buried insulating layer may be at least partially removed in the edge cell regions 120 to expose the bulk substrate. In some embodiments, the memory regions 105A-105J, hardmacro regions 110A-110B, and logic regions 115A, 115B are formed using isolating wells, such as a triple well isolation arrangement known in the art. The edge cell regions 120 are positioned outside the isolating well regions. For example, memory cell 105H is formed using an isolating well region 122 and edge cell regions 120 are positioned outside isolating well region 122. Each edge cell region 120 includes a plurality of edge cells arranged in columns.

Figure 2:
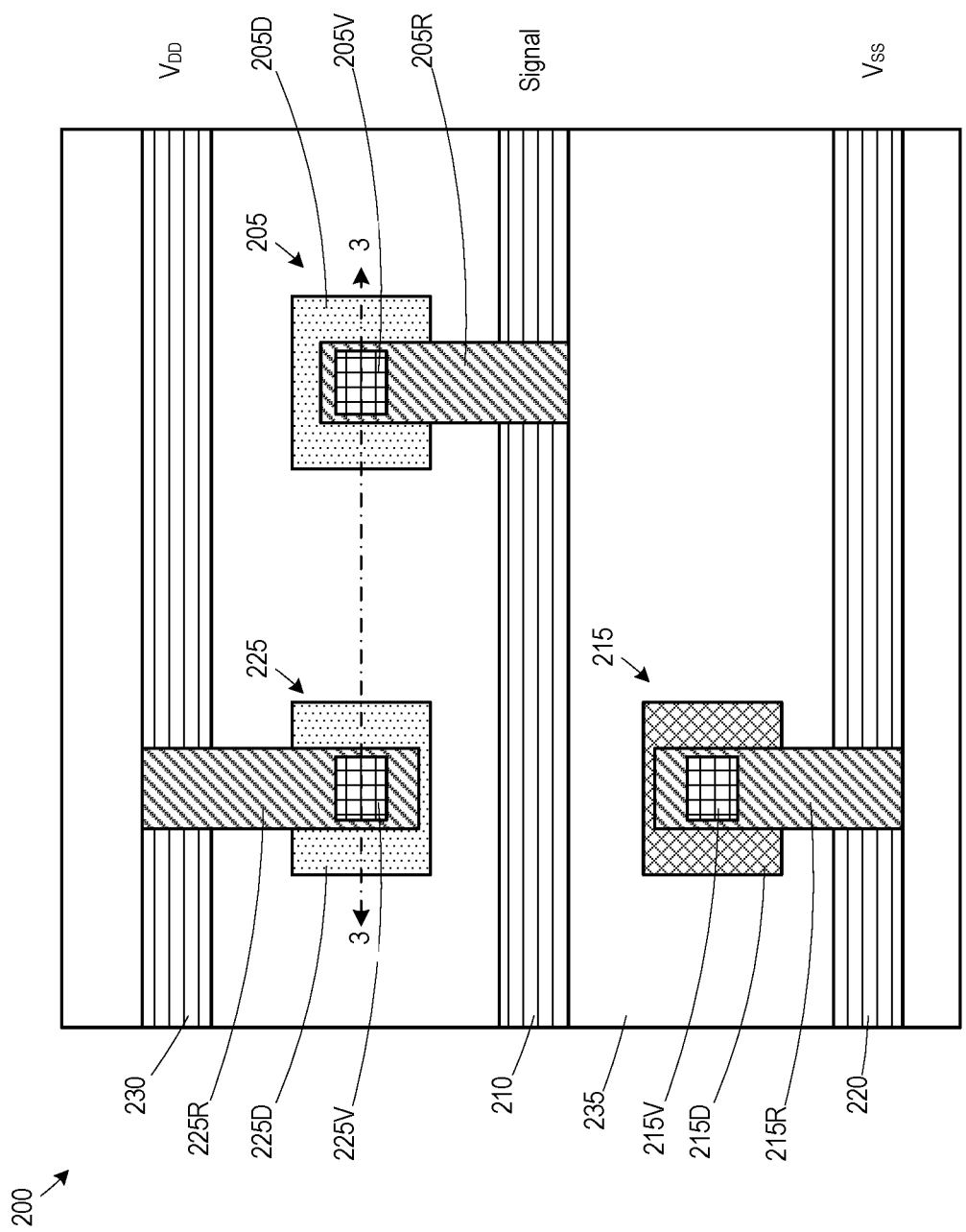
FIG. 2 is a diagram of an edge cell in one of the edge cell regions in the product of FIG. 1.
Figure 3:
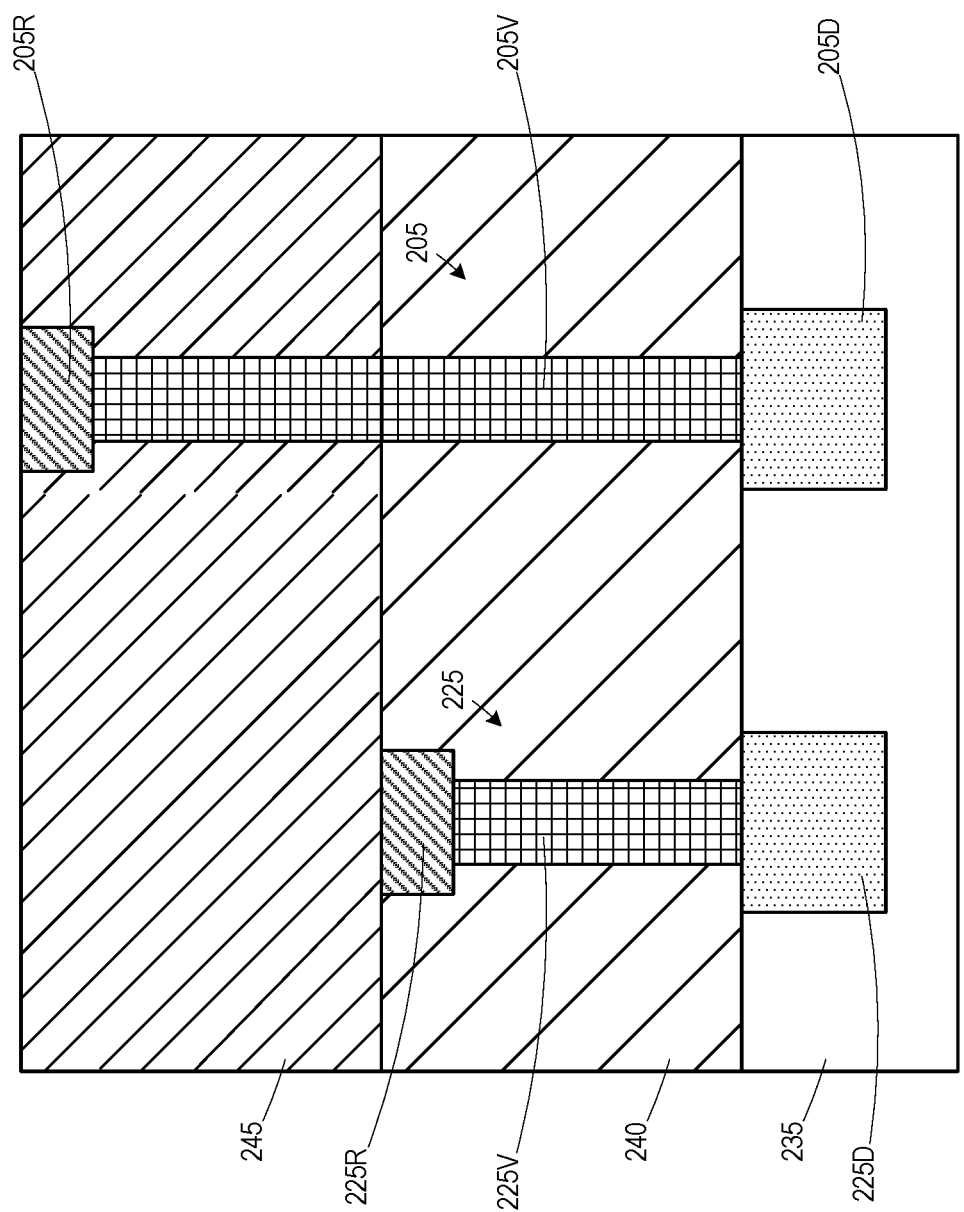
FIG. 3 is a cross-section view of the product taken along line 3-3 in FIG. 2 illustrating the signal line antenna diode and the power rail antenna diode.

FIG. 2 is a diagram of an edge cell 200 in one of the edge cell regions 120. The edge cell 200 has a signal line antenna diode 205 to provide protection for a signal line 210 traversing the associated device region. In some embodiments, the edge cell 200 includes a power rail contact 215 for a $V_{ss}$ power rail 220 and a power rail antenna diode 225 for a $V_{DD}$ power rail 230. FIG. 3 is a cross-section view of the product 100 taken along line 3-3 in FIG. 2 illustrating the signal line antenna diode 205 and the power rail antenna diode 225.

In general, the signal line 210 is distinguished from the power rails 220, 230 in that the signal line 210 carries data signals in the product, while the power rails 220, 230 provide supply voltages for the various devices in the product. In some embodiments, the power rail antenna diode 225 is omitted from one or more of the edge cells 200.

The signal line antenna diode 205 includes a doped region 205D formed in the bulk substrate 235, a via 205V connected to the doped region 205D through a first dielectric layer 240 (e.g., silicon dioxide, a low-k dielectric material, or an ultra-low-k dielectric material) formed above the bulk substrate 235), and a routing line 205R connecting the via 205V to the signal line 210. The doped region 205D has a conductivity type opposite that of the bulk substrate 235 to define a diode. For example, if the bulk substrate 235 is doped with a P-type dopant, the doped region 205D is doped with an N-type dopant. In the embodiment illustrated in FIG. 2, the signal line 210 crosses over the edge cell 200, and the routing line 205R accounts for lateral offset between the signal line 210 and the via 205V. In some embodiments, the signal line 210 crosses a different edge cell (not shown) and the routing line 205R crosses one or more underlying edge cells to connect the signal line 210 to the via 205V.

The contact region 215 includes a doped region 215D formed in the bulk substrate 235, a via 215V connected to the doped region 215D, and a routing line 215R connecting the via 215V to the $V_{ss}$ power rail 220. The doped region 215D has the same conductivity type as the bulk substrate 235 to define a direct contact. For example, if the bulk substrate 235 is doped with a P-type dopant, the doped region 215D is doped with a P-type dopant at a higher concentration than the bulk substrate 235.

The power rail antenna diode 225 includes a doped region 225D formed in the bulk substrate 235, a via 225V connected to the doped region 225D, and a routing line 225R connecting the via 225V to the $V_{DD}$ power rail 230. The doped region 225D has a conductivity type opposite that of the bulk substrate 235 to define a diode.

In some embodiments, the doped regions 205D, 215D, 225D are formed using masked implantation processes. In some embodiments, the doped regions 205D, 215D, 225D are formed using epitaxial growth processes.

In some embodiments, the power rails 220, 230 are formed in a first metallization layer of the product 100, such as an M1 layer including the dielectric layer 240, and the signal line 210 is formed in a second metallization layer including a dielectric layer 245 (e.g., silicon dioxide, a low-k dielectric material, or an ultra-low-k dielectric material) one or more layers above the first metallization layer. As a result, the via 205V may have multiple segments that span the various interceding dielectric layers 240, 245. The routing line 205R may be formed in the second metallization layer, while the routing lines 215R, 225R may be formed in the first metallization layer.

In some embodiments, all the edge cells 200 in each cell region 120 include signal line antenna diodes 205. In some embodiments, the edge cell regions 120 on one side of the device region includes edge cells with signal line antenna diodes 205 and the edge cell regions 120 on the other side of the same device region does not include signal line antenna diodes 205. In some embodiments, edge cells 200 with signal line antenna diodes 205 are interspersed at regular or irregular intervals within a particular edge cell region 120. Routing lines 205R are arranged according to the particular layout of the edge cell regions 120. The arrangement of edge cells 200 in the edge cell region 120 provides flexibility for placing the multiple routing lines 205R to accommodate multiple signal lines 210. Providing only a certain number of edge cells 200 with signal line antenna diodes 205 may reduce leakage of the product as compared to having edge cell regions 120 where signal line antenna diodes 205 are present in all edge cells 200.

Figures 4, 5:
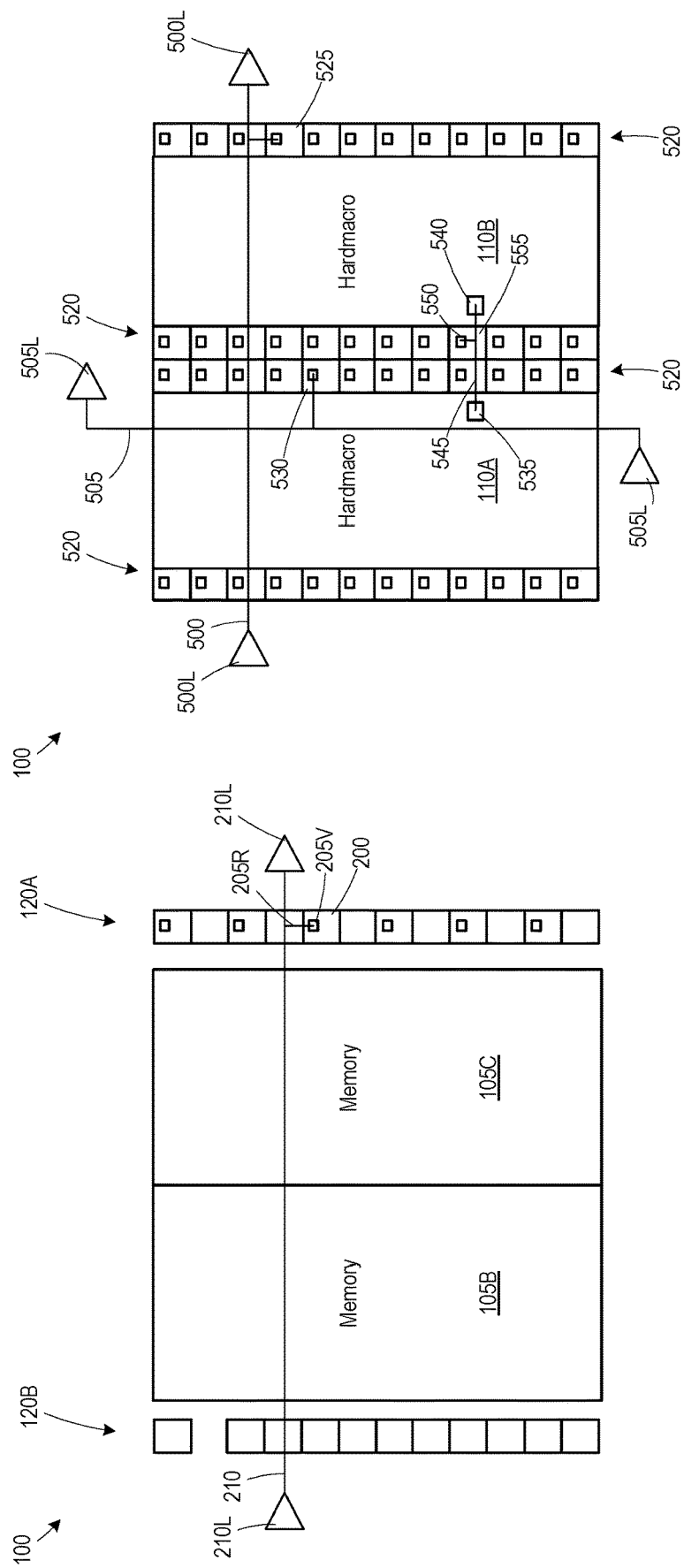
FIG. 4 illustrates a portion of the product including a signal line traversing memory regions.
FIG. 5 illustrates a portion of the product including signal line antenna diode protection for traversing signal lines and input/output pins.

FIG. 4 illustrates a portion of the product 100 including a signal line 210 traversing the memory regions 105B, 105C. Although only one signal line 210 is illustrated, many signal lines would be present in an actual implementation. In some embodiments, line drivers 210L are provided on ends of the signal line 210 to drive a data signal on the signal line 210. Note that the routing line 205R connects the signal line 210 to an edge cell 200 that is not directly below the signal line 210. The arrangement of edge cells 200 in a column in the edge cell regions 120A, 120B provides flexibility for placing the routing lines 205R to accommodate multiple signal lines 210. Note that the edge cell region 120A includes edge cells with signal line antenna diodes alternating with edge cells without signal line antennas diodes, and the edge cell region 120B does not include signal line antenna diodes.

FIG. 5 illustrates a portion of the product 100 including a first signal line 500 traversing the hardmacros 110A, 110B in one direction and a second signal line 505 traversing the hardmacro 110A in a different direction. In some embodiments, edge cell regions 520 with edge cell diodes 205 are incorporated into the fixed layout of each of the hardmacros 110A, 110B. Alternatively, edge cell regions 520 may be added to the layout if they are not already in the hardmacro design. The edge cell regions 520 may include various numbers and layouts of edge cells with signal line antenna diodes, as described above. In some embodiments, line drivers 500L, 505L are coupled to the associated signal lines 500, 505, respectively. In some embodiments, the signal lines 500, 505 are positioned in different metallization layers of the product 100. The signal line 500 is coupled to a signal line antenna diode in an edge cell 525 associated with the hardmacro 110B, and the signal line 505 is coupled to a signal line antenna diode in an edge cell 530 associated with the hardmacro 110A.

In some embodiments, input pins and output pins of the hardmacros 110A, 110B are provided with antenna diode protection. The hardmacro 110A includes an output pin 535 coupled to an input pin 540 of the hardmacro 110B by a signal line 545. In this embodiment, the signal line 545 traverses only a portion of each of the hardmacros 110A, 110B. The signal line 545 is connected to a signal line antenna diode 550 in an edge cell 555 associated with the hardmacro 110B. Alternatively, the signal line 545 may be connected to an edge cell associated with the hardmacro 110A. In some embodiments, the hardmacros 110A, 110B may be spaced apart with an intervening logic region 115 positioned therebetween. Line drivers may be located in the logic region 115 along the signal line 545 dividing the signal line 545 into sections. Each section of the signal line 545 may be connected to a signal line antenna diode in an edge cell. A first portion of the signal line 545 between the output pin 535 and the line driver may be connected to an edge cell associated with the hardmacro 110A, and a second portion of the signal line 545 between the line driver and the input pin 540 may be connected to an edge cell associated with the hardmacro 110B.

The use of edge cell regions 120 with edge cells 200 including signal line antenna diodes 205 has several advantages. The incorporation of the signal line antenna diodes 205 into edge cells requires no additional floor plan space, since conventional edge cells are present for the power rails 220, 230. The layout flexibility associated with rows of edge cells 200 avoids the clustering of antenna protection circuitry near input and output pins of hardmacros. Because connections to signal line antenna diodes 205 can be routed automatically using a script, and layout changes are not necessary to accommodate the signal line antenna diodes 205, the turn-around-time of a design is decreased.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
   a first device region defined above a substrate, wherein the first device region is isolated from the substrate by a buried insulating layer and is isolated from adjacent device regions by at least one isolating well region, the first device region comprising a first power rail configured to supply a voltage to the first device region;
   a first signal line traversing at least a first portion of the first device region configured to carry data signals; and
   a first plurality of edge cells positioned in the substrate adjacent the first device region and outside the at least one isolating well region, wherein at least a first edge cell of the first plurality of edge cells comprises:
      a substrate contact connecting the first power rail to the substrate; and
      a first signal line antenna diode connecting the first signal line to the substrate.

2. The device of claim 1, wherein the substrate has a first conductivity type and the first signal line antenna diode comprises a first doped region positioned in the substrate and having a second conductivity type opposite the first conductivity type.

3. The device of claim 2, wherein the substrate contact comprises a second doped region positioned in the substrate and having the first conductivity type.

4. The device of claim 1, wherein the first device region comprises a second power rail configured to supply the voltage to the first device region, and the at least one edge cell comprises a power rail antenna diode connecting the second power rail to the substrate.

5. The device of claim 4, wherein the substrate has a first conductivity type, the first signal line antenna diode comprises a first doped region positioned in the substrate and having a second conductivity opposite the first conductivity type, the power rail antenna diode comprises a second doped region positioned in the substrate and having the second conductivity type, and the substrate contact comprises a third doped region positioned in the substrate and having the first conductivity type.

6. The device of claim 1, further comprising a first via coupled to the first signal line antenna diode and a first routing line coupling the first via to the first signal line.

7. The device of claim 1, further comprising a second via coupled to the substrate contact and a second routing line coupling the second via to the first power rail.

8. The device of claim 7, wherein the first power rail is positioned in a first dielectric layer above the substrate, and the first signal line is positioned in a second dielectric layer positioned above the first dielectric layer.

9. The device of claim 1, further comprising a second signal line traversing at least a second portion of the first device region, wherein at least a second edge cell of the first plurality of edge cells comprises a second signal line antenna diode connecting the second signal line to the substrate.

10. The device of claim 9, wherein the first signal line is positioned in a first dielectric layer above the substrate, and the second signal line is positioned in a second dielectric layer positioned above the first dielectric layer.

11. The device of claim 9, wherein the first edge cell is separated from the second edge cell by at least one edge cell not having an associated signal line antenna diode.

12. The device of claim 1, further comprising a second device region defined above the substrate and positioned adjacent the first plurality of edge cells, wherein the second device region is isolated from the substrate by the buried insulating layer, the first device region comprises an output pin, and the second device region comprises an input pin connected to the output pin by the first signal line.

13. A method, comprising:
   forming a first device region defined above a substrate, wherein the first device region is isolated from the substrate by a buried insulating layer and is isolated from adjacent device regions by at least one isolating well region, the first device region comprising a first power rail configured to supply a voltage to the first device region;
   forming a first signal line configured to carry data signals, traversing at least a first portion of the first device region; and
   forming a first plurality of edge cells in the substrate adjacent the first device region and outside the at least one isolating well region, wherein forming the first plurality of edge cells comprises:
      forming a substrate contact in the substrate connecting the first power rail to the substrate for a first edge cell; and
      forming a first signal line antenna diode in the substrate connecting the first signal line to the substrate in the first edge cell.

14. The method of claim 13, wherein the substrate has a first conductivity type and forming the first signal line antenna diode comprises forming a first doped region in the substrate having a second conductivity type opposite the first conductivity type.

15. The method of claim 14, wherein forming the substrate contact comprises forming a second doped region in the substrate having the first conductivity type.

16. The method of claim 13, wherein the first device region comprises a second power rail configured to supply the voltage to the first device region, and forming the first plurality of edge cells comprises forming a power rail antenna diode connecting the second power rail to the substrate.

17. The method of claim 16, wherein the substrate has a first conductivity type, forming the first signal line antenna diode comprises forming a first doped region in the substrate having a second conductivity opposite the first conductivity type, forming the power rail antenna diode comprises forming a second doped region in the substrate having the second conductivity type, and forming the substrate contact comprises forming a third doped region positioned in the substrate having the first conductivity type.

18. The method of claim 13, further comprising:
    forming a first via coupled to the first signal line antenna diode;
    forming a first routing line coupling the first via to the first signal line;
    forming a second via coupled to the substrate contact; and
    forming a second routing line coupling the second via to the first power rail.

19. The method of claim 18, wherein the first power rail is positioned in a first dielectric layer formed above the substrate, and the first signal line is positioned in a second dielectric layer formed above the first dielectric layer.

20. The method of claim 13, further comprising:
    forming a second device region defined above the substrate, wherein the second device region is isolated from the substrate by the buried insulating layer;
    forming an output pin in the first device region;
    forming an input pin in the second device region; and
    forming the first signal line to connect the output pin to the input pin.

* * * * *